United States Patent
Borodzinski et al.

(10) Patent No.: US 11,586,421 B2
(45) Date of Patent: Feb. 21, 2023

(54) METHOD FOR MAKING COST-EFFECTIVE NICKEL-63 RADIATION SOURCE FOR TRUE RANDOM NUMBER GENERATORS

(71) Applicant: RANDAEMON sp. z o.o, Warsaw (PL)

(72) Inventors: Janusz Jerzy Borodzinski, Warsaw (PL); Jan Jakub Tatarkiewicz, San Diego, CA (US)

(73) Assignee: RANDAEMON SP. Z O.O., Warsaw (PL)

( * ) Notice: Subject to any disclaimer, the term of this patent is extended or adjusted under 35 U.S.C. 154(b) by 0 days.

(21) Appl. No.: 17/687,630

(22) Filed: Mar. 5, 2022

(65) Prior Publication Data
US 2023/0028491 A1 Jan. 26, 2023

Related U.S. Application Data (60) Provisional application No. 63/279,587, filed on Nov. 15, 2021, provisional application No. 63/277,759,
(Continued)

(51) Int. Cl.
C25D 3/12 (2006.01)
G06F 7/58 (2006.01)
(Continued)

(52) U.S. Cl.
CPC ............ *G06F 7/588* (2013.01); *C25D 3/12* (2013.01); *C25D 5/022* (2013.01); *C25D 5/12* (2013.01);
(Continued)

(58) Field of Classification Search
None
See application file for complete search history.

(56) References Cited

U.S. PATENT DOCUMENTS 3,445,591 A 5/1969 Koehler
3,546,356 A 12/1970 Graybill
(Continued)

FOREIGN PATENT DOCUMENTS

WO 2014/080272 5/2014
WO 2014080272 A1 5/2014

OTHER PUBLICATIONS

Kumar et al. "An electrochemical method for the preparation of 63Ni source for the calibration of thermoluminescence dosimeter (TLD)", Applied Radiation and Isotopes, 67, 2009, 1042-1049. (Year: 2009).*

(Continued)

*Primary Examiner* — Stefanie S Wittenberg
(74) *Attorney, Agent, or Firm* — Manuel de la Cerra (57) ABSTRACT

A method for electro-depositing a radioactive material onto a metal substrate is disclosed. This is particularly well-suited for true random number generators. The method includes (a) at least partially masking the metal substrate to expose a metallic surface on the metal substrate; (b) connecting the metal substrate to a cathode of a current source; (c) submersing the exposed metallic surface into a solution containing radioactive metal ions, wherein the solution is connected to an anode of the current source; (d) removing the exposed metallic surface from the solution; (e) removing the solution from the exposed metallic surface; (f) measuring the amount of radioactivity emitted from the exposed metallic surface; and (g) repeating steps (c) through (f) until the amount of radioactivity measured in step (f) is stabilized relative to a previous measurement.

5 Claims, 5 Drawing Sheets

Related U.S. Application Data filed on Nov. 10, 2021, provisional application No. 63/270,912, filed on Oct. 22, 2021, provisional application No. 63/235,031, filed on Aug. 19, 2021, provisional application No. 63/234,820, filed on Aug. 19, 2021, provisional application No. 63/224,811, filed on Jul. 22, 2021.

(51) Int. Cl.
  C25D 7/06 (2006.01)
  C25D 5/02 (2006.01)
  C25D 5/12 (2006.01)
  G21H 5/00 (2006.01)

(52) U.S. Cl.
  CPC ......... *C25D 7/0614* (2013.01); *C25D 7/0692* (2013.01); *G21H 5/00* (2013.01); *H05K 2203/0723* (2013.01)

(56) References Cited

U.S. PATENT DOCUMENTS

| | | | |
|---|---|---|---|
| 3,790,768 | A | 2/1974 | Chevalier |
| 4,527,798 | A | 7/1985 | Siekierski |
| 4,855,690 | A | 8/1989 | Dias |
| 4,905,176 | A | 2/1990 | Schulz |
| 5,570,307 | A | 10/1996 | Takahshi |
| 5,627,894 | A | 5/1997 | Albert |
| 5,732,138 | A | 3/1998 | Noll |
| 5,987,483 | A | 11/1999 | Edelkind |
| 6,249,009 | B1 | 6/2001 | Kim |
| 8,001,054 | B1 | 8/2001 | Peart |
| 6,346,700 | B1 | 2/2002 | Cunningham |
| 6,415,309 | B1 | 7/2002 | Shilton |
| 6,430,170 | B1 | 8/2002 | Saints |
| 6,539,410 | B1 | 3/2003 | Klass |
| 6,542,014 | B1 | 4/2003 | Saito |
| 6,687,721 | B1 | 2/2004 | Wells |
| 6,697,829 | B1 | 2/2004 | Shilton |
| 6,745,217 | B2 | 6/2004 | Figotkin |
| 7,031,991 | B2 | 4/2006 | Bars |
| 7,124,157 | B2 | 10/2006 | Ikake |
| 7,476,370 | B2 | 1/2009 | Mitsugashira |
| 8,001,168 | B2 | 8/2011 | Tsuyuzaki |
| 8,037,117 | B2 | 10/2011 | Saito |
| 8,058,612 | B2* | 11/2011 | Janata .................. C25D 5/022 250/493.1 |
| 9,335,972 | B2 | 5/2016 | Yang |
| 10,430,161 | B1 | 10/2019 | Tatarkiewicz |
| 11,036,473 | B1 | 6/2021 | Tatarkiewicz |
| 2004/0035201 | A1 | 2/2004 | Vincze |
| 2005/0189225 | A1* | 9/2005 | Liu .................. B01L 3/0268 204/600 |
| 2009/0165086 | A1 | 6/2009 | Trichina |
| 2012/0030268 | A1 | 2/2012 | Liu |
| 2015/0064047 | A1 | 3/2015 | Elwha |
| 2018/0217817 | A1 | 8/2018 | Gorfinkle |
| 2019/0258458 | A1 | 8/2019 | Walmsley |
| 2019/0310830 | A1 | 10/2019 | Tatarkiewicz |
| 2019/0347076 | A1 | 11/2019 | Park |
| 2020/0065068 | A1 | 2/2020 | Hekmatshoartabari |
| 2020/0092328 | A1 | 3/2020 | Kim |
| 2020/0210147 | A1 | 7/2020 | Lee |

OTHER PUBLICATIONS

Kharitonov et al. "Deposition of 63Ni onto a semiconductor structure of power cells", Radiochemistry, 2018, 60, 1, 23-25. (Year: 2018).*
B. Škorić 2015 Lecture notes 2IMS10 Technical University Eindhoven (Holland) Physical aspects of digital security.
D.F. Williams et al. 1993 Oak Ridge National Laboratory TM-12399 Recovery and Purification of Nickel-63 from HFIR-irradiated Targets.
J. von Neumann 1951 Res. Nat. Bur. Stand. Appl. Math Series 3, 36-38 Various techniques used in connection with random digits.
M.J. Berger and S.M. Seltzer 1982 National Bureau of Standards NBSIR 82-2550 Stopping Powers and Ranges of Electrons and Positrons.
M.-M. Bé et al. 2008 Bureau International des Poids et Mesures, Sevres (France) BIPM-5 vol. 1-4 Table of Radionuclides.
NRC Personal Annual Radiation Dose Calculator https://www.nrc.gov/aboutnrc/radiation/around-us/calculator.html.
Patuleanu et al. 2017 Proc. Romanian Acad. series A, vol. 18, 389-402 True random number sequences from gamma-decay using four extraction methods.
International Search Report and Written Opinion for PCT/US2019/017748 dated Dec. 30, 2019 (6 pages).
Jones on "True random number generators for a more secure IoT", Mar. 2016. Retrieved on [Oct. 29, 2020]. Retrieved from the Internet <https:l/www.techdesignforums.com/practice/technique/true-random-number-generators-for-more-secure-systems/> (Year: 2016).
S. Burri, D. Stucki, Y. Maruyama, C. Bruschini, E. Charbon and F. Regazzoni, "SPADs for quantum random number generators and U beyond," 2014 19th Asia and South Pacific Design Automation Conference (AS P-DAC), Singapore, 2014, pp. 788-794, doi: 10.1109/ASPDAC.2014.6742986. (Year: 2014).
Duggirala R., Lal A., Radhakrishnan S. (2010) Radioisotope Decay Rate Based Counting Clock. In: Radioisotope Thin-Film Powered Microsystems. MEMS Reference Shelf, vol. 6. Springer, New York, NY. https://doi.org/10.1007/978-1-4419-6763-3_7 (Year: 2010).
Collantes et al. "Quantum Random Number Generators", 2016 Retrieved from the Internet <https://arxiv.org/pdf/1604.03304.pdf> (Year: 2016).
Rohe, "RANDy—A True-Random Generator Based on Radioactive Decay", 2003. Retrieved from the Internet <https://citeseerx.ist.psu.edu/viewdoc/download?doi=1 0.1.1.11 0.9725&rep=rep1 &type=pdf> (Year: 2003).
International Search Report in PCT/US2020/065962 dated Apr. 22, 2020 (6 pages).
International Search report for PCT/EP2022/070434 dated Nov. 17, 2022 (11 pages).

\* cited by examiner

ALIGN

FIG. 4D

BIND

FIG 5

METHOD FOR MAKING COST-EFFECTIVE NICKEL-63 RADIATION SOURCE FOR TRUE RANDOM NUMBER GENERATORS

PRIORITY APPLICATIONS AND REFERENCES

This application claims priority to U.S. Provisional Application Ser. 63/279,587 titled "Method for Cost-Effective Nickel-63 Radiation Source for True Random Number Generators", filed on Nov. 15, 2021; to U.S. Provisional Application Ser. 63/277,759 titled "Method for Cost-Effective Nickel-63 Radiation Source for True Random Number Generators", filed on Nov. 10, 2021; to U.S. Provisional Application Ser. 63/224,811 titled "Method And Apparatus For Highly Effective Beta Decay Based On-Chip True Random Number Generator", filed on Jul. 22, 2021; to U.S. Provisional Application Ser. 63/234,820 titled "Method And Apparatus For Highly Effective Beta Decay Based On-Chip True Random Number Generator", filed on Aug. 19, 2021; to U.S. Provisional Application Ser. 63/235,031 titled "Method And Apparatus For Highly Effective Beta Decay Based On-Chip True Random Number Generator" filed on Aug. 19, 2021; and to U.S. Provisional Application Ser. 63/270,912 titled "Method And Apparatus For True Random Number Generator Based On Nuclear Radiation", filed on Oct. 22, 2021, all of which are incorporated herein by reference in their entireties.

This application is also related to U.S. application Ser. No. 17/513,661 titled "Method And Apparatus For Highly Effective Beta Decay Based On-Chip True Random Number Generator", filed on Oct. 28, 2021; to U.S. application Ser. No. 17/409,971 filed on Aug. 24, 2021, titled "Method And Apparatus For Highly Effective On-Chip True Random Number Generator Utilizing Beta Decay"; to U.S. Provisional Application Ser. 62/984,528 filed on Mar. 3, 2020, titled "Method And Apparatus For Tritium-Based True Random Number Generator"; to U.S. Provisional Application Ser. 63/062,672 filed on Aug. 7, 2020, titled "Method And Apparatus For Beta Decay Based True Random Generator"; to U.S. Provisional Application Ser. 62/655,172 filed on Apr. 9, 2018, titled "Apparatus, Systems, And Methods Comprising Tritium Random Number Generator"; to U.S. Provisional Application Ser. 62/803,476 filed on Feb. 9, 2019, titled "Apparatus, Systems, And Methods Comprising Tritium Random Number Generator", now U.S. Pat. No. 10,430,161; to U.S. application Ser. No. 16/273,365 filed on Feb. 12, 2019, titled "Apparatus, Systems, And Methods Comprising Tritium Random Number Generator"; to U.S. application Ser. No. 16/990,087 filed on Aug. 11, 2020, titled "Apparatus, Systems, And Methods For Beta Decay Based True Random Number Generator", now U.S. Pat. No. 10,901,695; to U.S. application Ser. No. 17/126,265 filed on Dec. 18, 2020, titled "Method and Apparatus for Tritium-based True Random Number Generator", now U.S. Pat. No. 11,048,478; to U.S. application Ser. No. 17/062,307 filed on Oct. 2, 2020, titled "Apparatus, Systems, And Methods For Beta Decay Based True Random Number Generator", now U.S. Pat. No. 11,036,473; to PCT Application SN PCT/US19/17748 titled "Apparatus, Systems, And Methods Comprising Tritium Random Number Generator", filed on Feb. 13, 2019; to PCT Application SN PCT/US20/65962 titled "Apparatus, Systems, And Methods For Beta Decay Based True Random Number Generator" filed on Dec. 18, 2020; and to PCT Application SNPCT/US20/65976 titled "Apparatus, Systems, And Methods For Beta Decay Based True Random Number Generator", filed on Dec. 18, 2020. Each of the patent applications, issued patents, and other references discussed and/or cited herein, are incorporated by reference as if fully set forth herein.

TECHNICAL FIELD

The present disclosure relates generally to true random number generators, and more specifically to random number generator technologies utilizing the spontaneous nickel 63 isotope decay, as well as apparatus, systems, and methods regarding the same.

BACKGROUND

As opposed to pseudo-random number generators based on numerical algorithms, there are true random number generator (TRNG) devices that depend on natural random processes: multiple bipolar switches, thermal noise, light scattering by dichroic mirrors, chaotic systems, decay of radioactive nuclei. Some of these TRNGs are listed in the provisional applications to which the present application claims priority, and those references are incorporated herein by reference as if fully set forth herein.

The decay of radioactive nuclei type is considered to be the most independent from environmental influences like temperature, pressure, or acceleration. However, typical nuclear-based TRNGs that use alpha particles or gamma radiation require large-sized detectors to enable the registration of radiation emitted as a result of radioactive decays. Also, many nuclei used in such devices are highly radioactive and poisonous, hence dangerous to humans if a device is broken.

In previous disclosures by the present inventors, a TRNG is disclosed. For example, in U.S. Pat. No. 10,901,695, entitled "Apparatus, systems, and methods for beta decay based true random number generator", an array of detectors is employed, and a method of adjusting counts by changing the read-out time is described. The contents of that patent are incorporated herein by reference. The source of entropy in the '695 patent is a thin layer of nickel-63 attached to the inner surface of the metallic cover of the package of the integrated circuit (IC). Nickel-63 is one of few isotopes that are purely beta radioactive, i.e., it decays produce just energetic electrons with additional anti-neutrinos that practically do not interact with anything.

It is worth noting that radioactive material $^{63}$Ni is fairly expensive. According to Olsen L. C. et al. *Betavoltaic power sources*, Physics Today 2012 vol. 65, no. 12, p. 35, the cost is about $4,000 per Ci of nickel-63 radioactivity. The application mentioned above requires about 1 cm$^2$ of the foil, with about 15 microns thickness because due to self-absorption, only a very thin layer of beta radioactive material can emit electrons outside. The maximum energy of electrons emitted from nickel-63 is 67 keV; the range of 70 keV electrons in metals like Ni or Cu is about 13.5 microns, cf. U.S. Department of Commerce, National Bureau of Standards, 1982 NBSIR 82-2550 *Stopping powers and ranges of electrons*.

Typically, nickel-63 foils have maximum surface radioactivity of about 15 mCi per square centimeter, independent from their thickness if it is more than 15 microns, cf. ref 3. The above-mentioned data translates into the cost of about $60 per 1 cm$^2$ source, which is reasonable from the point of view of product cost management. However, handling such a 15-micron thick metallic foil and gluing it onto the enclosure IC can be very tricky.

Therefore, a cost-effective method for making a radiation source in a TRNG would be advantageous. Such a TRNG can then be used in compact personal devices.

SUMMARY

A method for electro-depositing a radioactive material onto a metal substrate is disclosed. This is particularly well-suited for true random number generators. The method includes (a) at least partially masking the metal substrate to expose a metallic surface on the metal substrate; (b) connecting the metal substrate to a cathode of a current source; (c) submersing the exposed metallic surface into a solution containing radioactive metal ions, wherein the solution is connected to an anode of the current source; (d) removing the exposed metallic surface from the solution; (e) removing the solution from the exposed metallic surface; (f) measuring the amount of radioactivity emitted from the exposed metallic surface; and (g) repeating steps (c) through (f) until the amount of radioactivity measured in step (f) is stabilized relative to a previous measurement.

The measurements in step (f) should be taken with the same geometry of measurement apparatus and elements measured each time. The radioactive metal ions may be nickel-63.

The metal substrate may also have an exposed current connection surface, and step (b) includes connecting the cathode to the exposed current connection surface. After step (g), the exposed current connection surface may be detached from the metal substrate. The exposed current connection surface may be a loop or a tab.

The method may further include the following steps to manufacture an enclosed microchip: (h) providing a unenclosed micro-chip comprising a detector with a detection surface; (i) after step (g), aligning the exposed metallic surface of the metal substrate with the detection surface; and (j) binding the metal substrate above detectors to form an enclosed microchip, wherein the binding (1) maintains the alignment of step (i), and (2) prevents the emission of electrons from the exposed metallic surface to the outside of the enclosed microchip.

The above method may be used to form the radioactive source of a TRNG. The TRNG may further include an enclosure to which the metallic surface with radioactive source is attached, or to which the enclosure was simply electroplated using above-described method, thus creating a cavity separating the radioactive source from a detector. The detector is constructed to detect electrons within the cavity from the decay of the radioactive source and to produce a signal for the detected energy. A processor connected to the detector may produce a true random number based on the signal for the detected energy.

Additional aspects, alternatives, and variations as would be apparent to persons of skill in the art are also disclosed herein and are specifically contemplated as included as part of the invention. The invention is set forth only in the claims as allowed by the patent office in this or related applications, and the following summary descriptions of certain examples are not in any way to limit, define or otherwise establish the scope of legal protection.

BRIEF DESCRIPTION OF DRAWINGS

The invention can be better understood with reference to the following figures. The components within the figures are not necessarily to scale, emphasis instead being placed on clearly illustrating example aspects of the invention. In the figures, like reference numerals designate corresponding parts throughout the different views and/or embodiments. Furthermore, various features of different disclosed embodiments can be combined to form additional embodiments, which are part of this disclosure. It will be understood that certain components and details may not appear in the figures to assist in more clearly describing the invention.

DETAILED DESCRIPTION OF EXAMPLE EMBODIMENTS

Reference is made herein to some specific examples of the present invention, including any best modes contemplated by the inventor for carrying out the invention. Examples of these specific embodiments are illustrated in the accompanying figures. While the invention is described in conjunction with these specific embodiments, it will be understood that it is not intended to limit the invention to the described or illustrated embodiments. On the contrary, it is intended to cover alternatives, modifications, and equivalents, as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, process operations well known to persons of skill in the art have not been described in detail in order not to obscure unnecessarily the present invention. Various techniques and mechanisms of the present invention will sometimes be described in singular form for clarity. However, it should be noted that some embodiments include multiple iterations of a technique or multiple mechanisms unless noted otherwise. Similarly, various steps of the methods shown and described herein are not necessarily performed in the order indicated, or performed at all in certain embodiments. Accordingly, some implementations of the methods discussed herein may include more or fewer steps than those shown or described. Further, the techniques and mechanisms of the present invention will sometimes describe a connection, relationship, or communication between two or more entities. It should be noted that a connection or relationship between entities does not necessarily mean a direct, unimpeded connection, as a variety of other entities or processes may reside or occur between any two entities. Consequently, an indicated connection does not necessarily mean a direct, unimpeded connection, unless otherwise noted.

The following list of example features corresponds to the attached figures and is provided for ease of reference, where like reference numerals designate corresponding features throughout the specification and figures:

Metallic Substrate 5
Current Connection Surface 10
Mask 15
Exposure Window 20
Masked Metallic Substrate 25
Current Source 26
Exposed Metallic Surface 30
Exposed Current Connection Surface 35
Upper Enclosure of the Microchip 40
Enclosure Inside Surface with Electro-deposited Radioactive Material 45
Exposed Current Connection Surface with Electro-deposited Radioactive Material 50
Un-enclosed Microchip 55
Detectors 60
Detection Surface 62
Integrated Circuit 63
Enclosed Microchip 65
Cavity 70
Enclosure 75
Amplifier 80
Filter 82
Processor 85
Signal Processor 87
Memory 89
Cryptographical Client 90
Method for Electro-Depositing a Radioactive Material onto the Metal Substrate 110-165.

This is related to our previous published US patents and applications listed above, in which we described the general idea of using pure beta-minus (electron emission) nuclear decay as a medium or source of entropy for generating true random numbers by detecting emitted electrons on-chip through an electronic sensor or array of sensors. In this application, we present an approach to manufacture the radiation source to be used in the previously disclosed TRNGs, as a thin layer without the handling concerns. The radioactive source may be electrodeposited. 63Ni is available in a solution as nickel chloride.

Figure 1A:
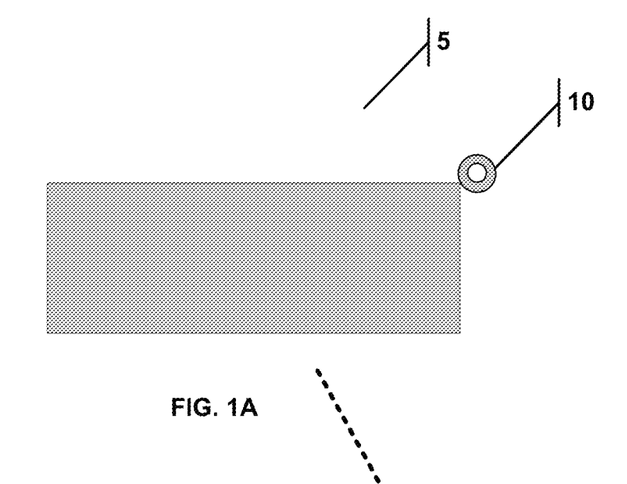
FIG. 1A illustrates a metallic substrate with a current connection surface.
Figure 1B:
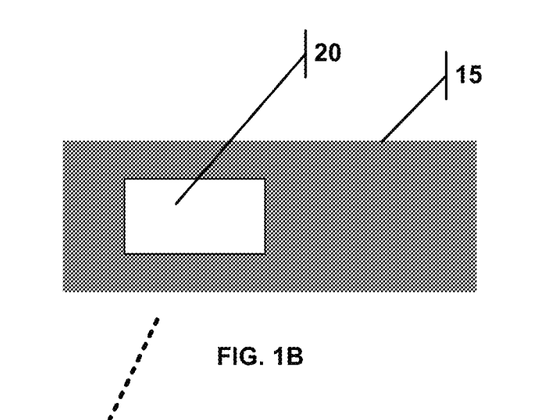
FIG. 1B illustrates a mask with an exposure window.
Figure 1C:
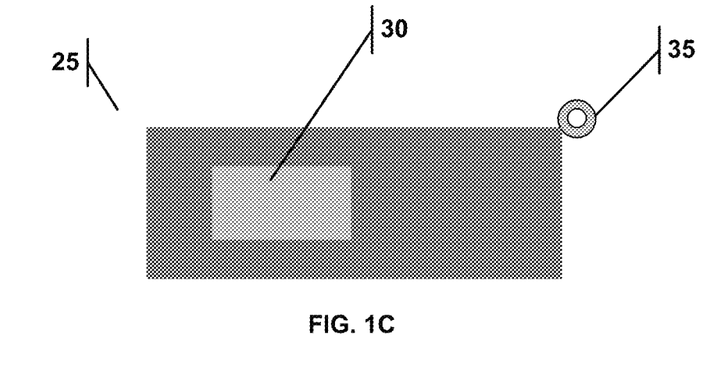
FIG. 1C illustrates the metallic substrate masked to expose a metallic surface.

FIG. 1 illustrates a metallic substrate 5 with a current connection surface 10. A mask 15 with an exposure window 20 is shown in FIG. 1B. Masking may be done with laser-cut self-adhesive foils that are resistant to water. It is advantageous to cover both sides of the metallic substrate 5 with the mask 15, because electrodeposition of the radioactive material in any area but the area exposed by the exposure window 20 would be detrimental and would affect the operations of the TRNG and the well-being of the whole IC (radiation damages). However, the metallic substrate 5 being electroplated needs to be connected to a source of electric current (26, shown in FIG. 2). Thus, a portion of the metallic substrate 26 should also be exposed to allow connection to the current source. This is shown as a small loop, tab or other current connection surface 10 that can be used to hang the metallic substrate 5 on the production rack before submerging it into the electroplating tank. Since the current connection surface will be loaded with radioactive material during electroplating, it is preferred to remove the current connection surface 10 after electroplating. This is discussed below with reference to FIGS. 3A and 3B.

Before detailing this construction, the method for electrodepositing the correct amount of radioactive material will first be disclosed. Adding more radioactive material than needed can be costly when manufacturing thousands of IC devices. To prevent too-thick deposition, one should consider how the thickness of the deposited material will be estimated during the deposition of the radioactive source. Typically for electroplating, this is done by measuring the current and time of electroplating. Since electroplating in the case of an expensive solution will be done in a small volume tank, one needs to account for the changes in time of the current flowing through the whole system. This is usually done by integrating the total charge using the third electrode. To estimate if enough of the material was already deposited, one needs to check from time to time the thickness of the deposited layer. This can be done by removing the substrate being covered from the bath, cleaning and drying them (electrons are absorbed even in a thin layer of water—the range of 70 keV electrons in water is about 78 microns only), and by measuring the radioactivity of the radioactive surfaces. If the readings of counts per second on the radioactivity counter are stable compared to previous readings, and they are no longer increasing when the same geometry of measurement is maintained, then enough radioactive material has been deposited. Otherwise, if the counts are still increasing, one needs to place the substrate into the bath for more electroplating.

Figure 2:
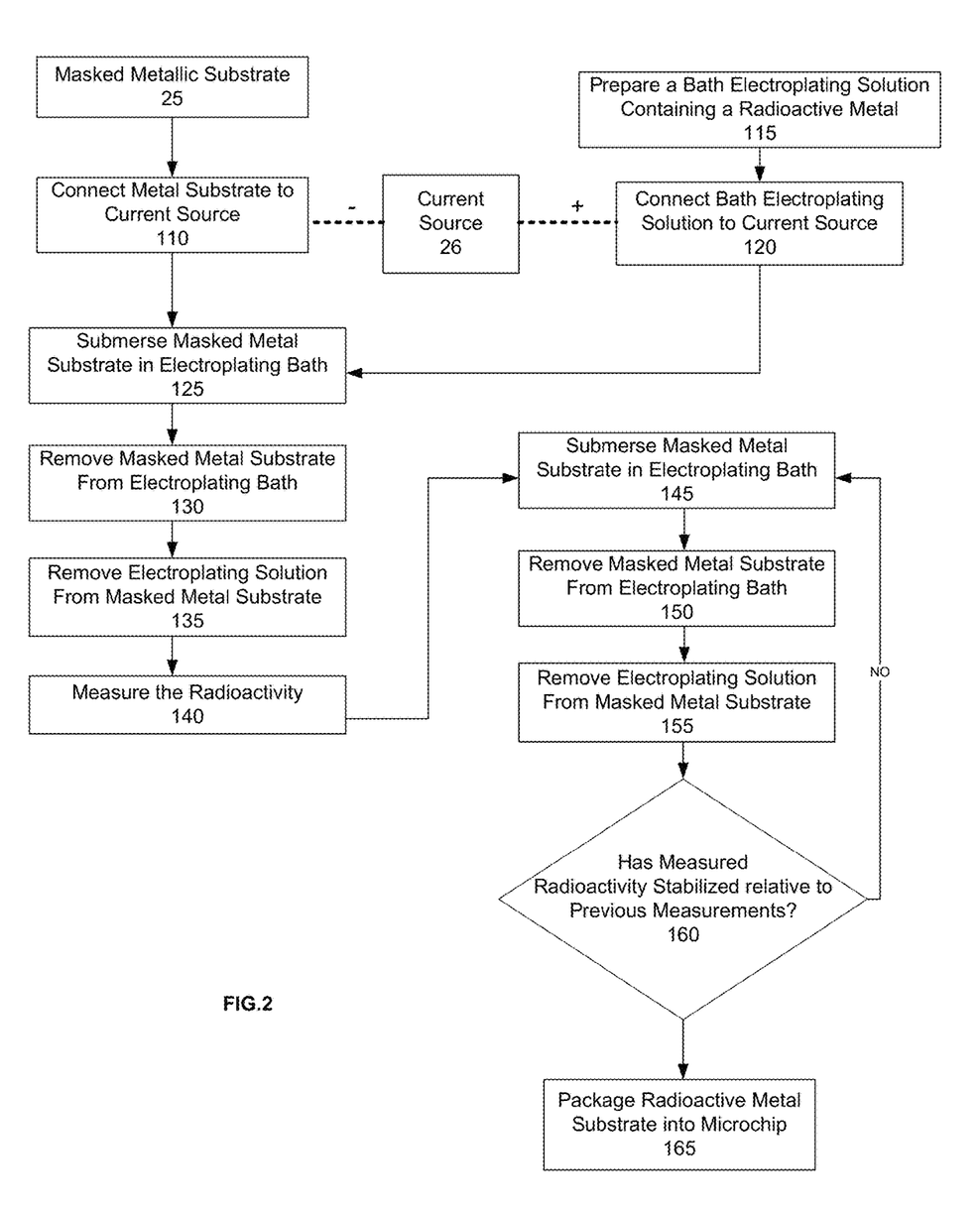
FIG. 2 illustrates a method for electro-depositing a radioactive material onto the metal substrate.

FIG. 2 presents a flowchart for the just-described method. The masked metallic substrate 25 is connected to the current source 26 in step 110, usually the cathode or negative electrode of the current source 26. A bath is prepared containing the radioactive metal ions in step 115, and the bath is also connected to the current source in step 120, usually the anode or positive electrode of the current source 26. The masked metallic substrate 25 is submersed in the electroplating bath (step 125). To begin checking whether sufficient radioactive material has electrodeposited, the masked metallic substrate 25 is removed from the electroplating bath (step 130), and the solution is cleaned and dry from the masked metallic substrate 25 (step 135). The radioactivity is measured at step 140, and the masked metallic substrate 25 is returned to the electroplating bath in step 145. Again, the masked metallic substrate 25 is removed from the bath, cleaned and dried (steps 150, 155), and the radioactivity is measured at step 160 to determine if the measurement has stabilized from previous measurements. If it has not, the masked metallic substrate 25 is returned to the bath in step 145, and the process is repeated. However, if at step 160 the radioactivity measurements have stabilized, the masked metallic substrate 25 can then be packaged into a microchip (step 165).

Figure 3A:
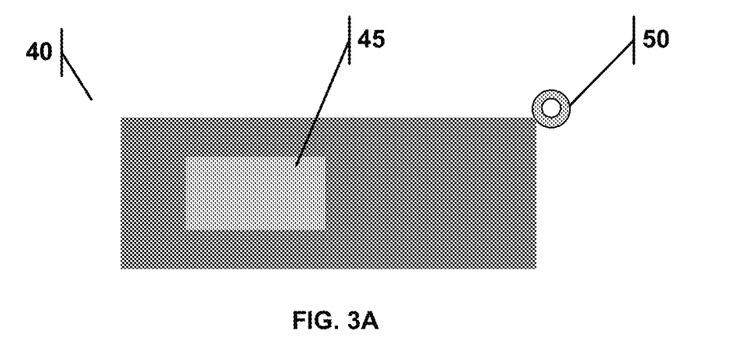
FIG. 3A illustrates the metallic substrate with radioactive material deposited on the exposed metallic surfaces, which will be used as the upper enclosure of the microchip.
Figure 3B:
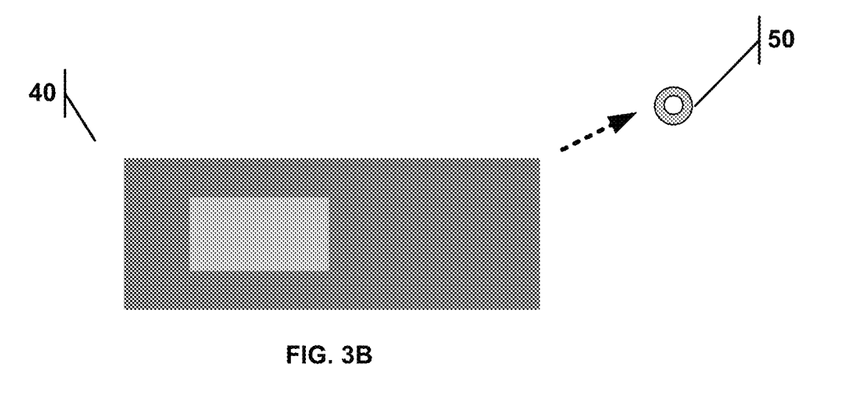
FIG. 3B illustrates detaching the current connection surface.

In FIG. 3A, the post-electroplated masked metallic substrate, which will now be used as the upper enclosure of the microchip 40 (and referred to herein as such), contains an inside surface with electrodeposited radioactive material 45 and an exposed current connection surface with electrodeposited radioactive material 50. In FIG. 3B, the exposed current connection surface with electrodeposited radioactive material 50 is removed so that the upper enclosure of the microchip 40 may be used as the radiation source for a TRNG microchip, the construction of which is shown in FIGS. 4A-5D.

Figure 4A:
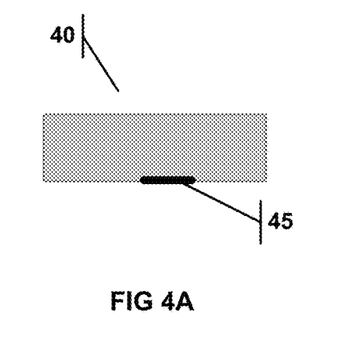
FIGS. 4A-4D illustrate the construction of an enclosed microchip. Specifically, the upper enclosure of the microchip with radioactive material deposited on the inside surface (FIG. 4A, shown in cross-sectional side view) is combined with the un-enclosed microchip containing a detector (FIG. 4B, shown in cross-sectional side view). Prior to binding, the upper enclosure and the un-enclosed microchip are aligned (FIG. 4C, shown in cross-sectional side view), then both parts are bound to each other (FIG. 4D, shown in cross-sectional side view).
Figure 4B:
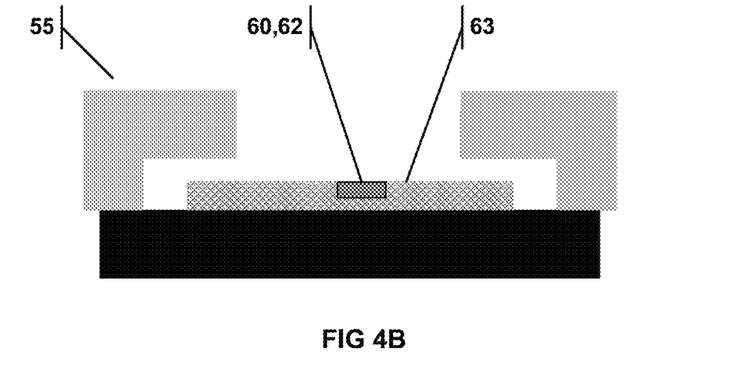
Figure 4C:
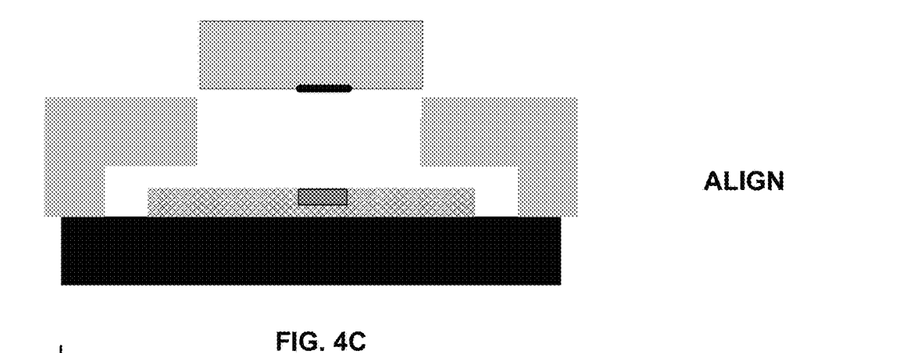
Figure 4D:
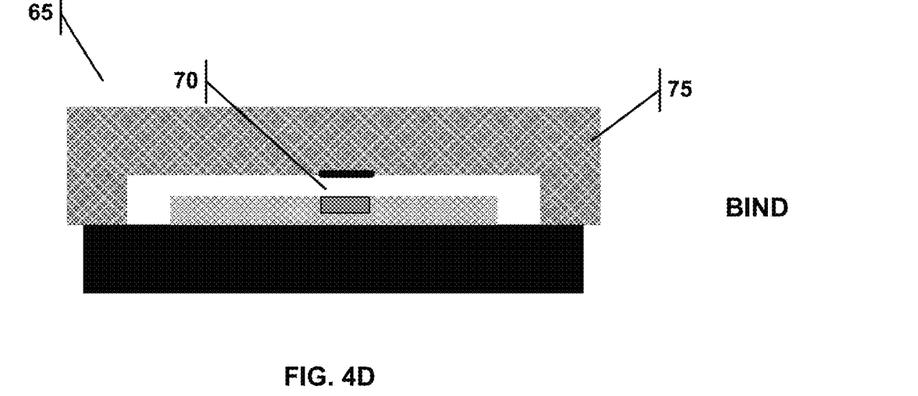

FIG. 4A illustrates the upper enclosure of the microchip 40, while FIG. 4B shows the un-enclosed microchip 55. The un-enclosed microchip 55 may include an integrated circuit 63 with detectors 60 that form a detection surface 62 to detect electrons from the decay of the radioactive source and to produce a signal for the detected energy. The upper enclosure of the microchip 40 is first aligned with the un-enclosed microchip 55 in FIG. 4C. Alignment means that the enclosure inside surface with electro-deposited radioactive material 45 aligns with the detection surface 62. The two parts are then bound together to form an enclosed microchip 65 with an enclosure 75 (shown in cross-hatch). Binding (1) maintains the alignment and (2) prevents the emission of electrons from the exposed metallic surface 45 to the outside of the enclosed microchip 65. Within the enclosed microchip 65 may be a cavity 70 separating the enclosure inside surface with electro-deposited radioactive material 45 from the detection surface 62. Binding also maintains the distance across the cavity 70 so that the TRNG microchip will operate in a consistent and reliable manner.

Figure 5:
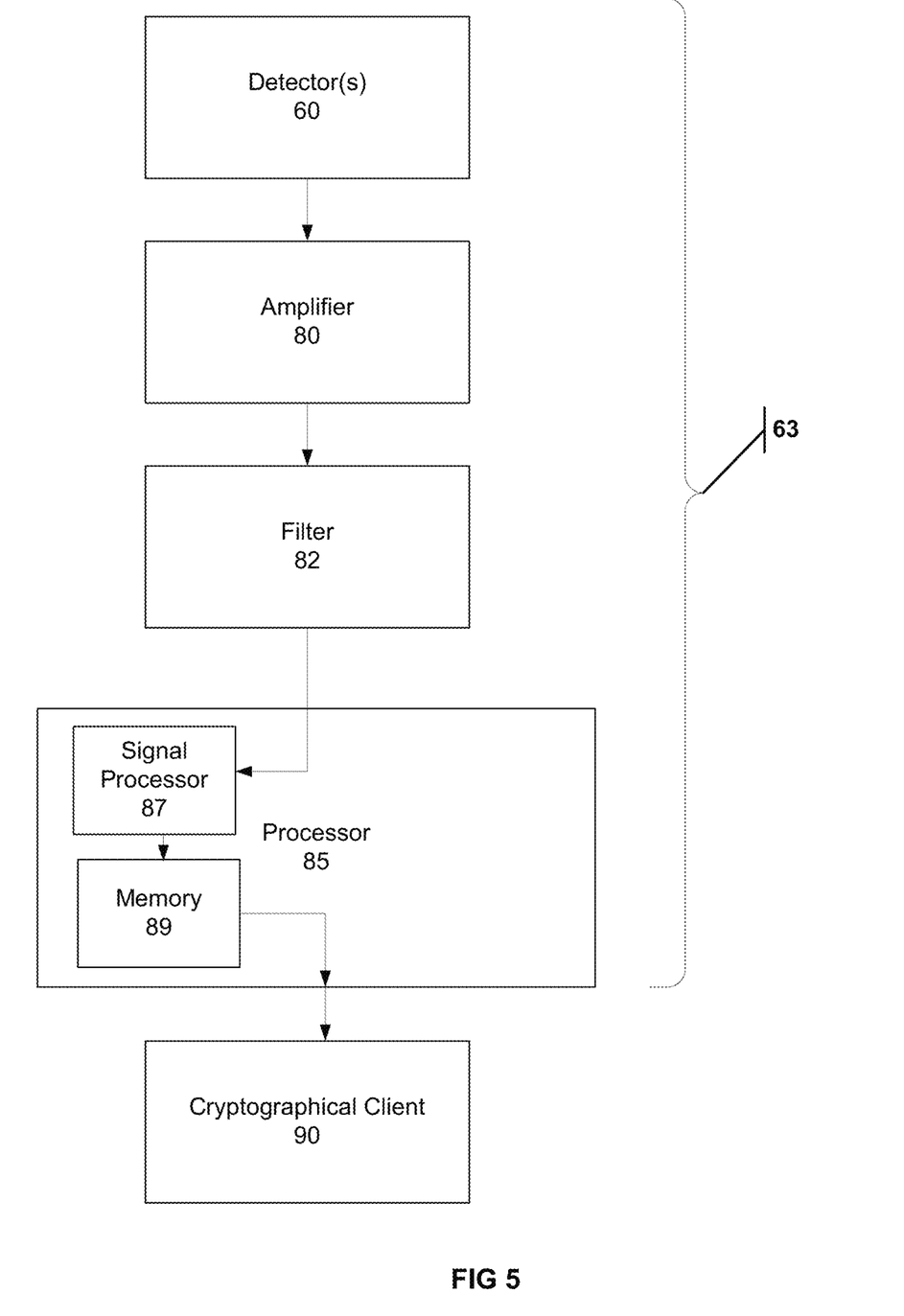
FIG. 5 is a flow diagram of the various components that may be place on the integrated circuit.

As shown in FIG. 5, the integrated circuit 63 that may further include an amplifier 80 (such as a low noise charge-sensitive preamplifier and pulse shaping amplifier), a filter 82, and processor 85, as shown in FIG. 2. The filtered signal is processed by processor 85 to determine if the signal corresponds to the electron emitted in a decay of radioactive material and not by other energetic ionizing particle(s). The processor 85 may include a signal processor 87 that performs this function, and may dump its results to a memory 89. The processor 85 may produce a true random number based on the signal from the detectors 60. The operation of these electrical subcomponents is discussed in the above-referenced patent applications, and is incorporated herein.

Any of the suitable technologies, materials, and designs set forth and incorporated herein may be used to implement various example aspects of the invention, as would be apparent to one of skill in the art.

Although exemplary embodiments and applications of the invention have been described herein including as described above and shown in the included example Figures, there is no intention that the invention be limited to these exemplary embodiments and applications or to the manner in which the exemplary embodiments and applications operate or are described herein. Indeed, many variations and modifications to the exemplary embodiments are possible as would be apparent to a person of ordinary skill in the art. The invention may include any device, structure, method, or functionality, as long as the resulting device, system, or method falls within the scope of one of the claims that are allowed by the patent office based on this or any related patent application.

The invention claimed is:

1. A method for electro-depositing a radioactive material onto a metal substrate comprising:
   a. at least partially mask the metal substrate to define a deposition area on the metal substrate;
   b. connect the metal substrate to a cathode of a current source;
   c. submerse the deposition area into a solution containing radioactive nickel-63 metal ions, wherein the solution is connected to an anode of the current source, and apply a current to promote electrodeposition of the radioactive nickel-63 metal ions in the deposition area;
   d. remove the deposition area from the solution;
   e. remove the solution from the deposition area;
   f. measure the amount of radioactivity emitted from the deposition area; and
   g. repeat steps (c) through (f) until the amount of radioactivity measured in step (f) is stabilized relative to a previous measurement.

2. The method of claim 1, wherein the metal substrate comprises an exposed current connection surface, wherein step (b) further comprises connecting the cathode to the exposed current connection surface, the method further comprising:
   after step (g), detach the exposed current connection surface from the metal substrate.

3. The method of claim 2, wherein the exposed current connection surface comprises a loop or a tab.

4. The method of claim 1, wherein the measurements in step (f) are taken from a same geometry of measurement.

5. The method of claim 1, further comprising:
   h. provide an un-enclosed micro-chip comprising a detector with a detection surface;
   i. after step (g), align the deposition area of the metal substrate with the detection surface; and
   j. bind the metal substrate with the un-enclosed microchip to form an enclosed microchip, wherein the binding (1) maintains the alignment of step (i) and (2) prevents the emission of electrons from the deposition area to the outside of the enclosed microchip.

* * * * *